United States Patent [19]
Lau et al.

[11] Patent Number: 5,929,141
[45] Date of Patent: Jul. 27, 1999

[54] ADHESIVE OF EPOXY RESIN, AMINE-TERMINATED BAN AND CONDUCTIVE FILLER

[75] Inventors: Steven E. Lau; Deborah S. Huff, both of Harbor City; Ralph D. Hermansen, Northridge; E. Dean Johnston, Fullerton, all of Calif.

[73] Assignee: Raytheon Company, Lexington, Mass.

[21] Appl. No.: 08/901,153

[22] Filed: Jul. 28, 1997

Related U.S. Application Data

[63] Continuation of application No. 08/664,701, Jun. 18, 1996, abandoned.

[51] Int. Cl.$^6$ .................................................. C08K 3/08
[52] U.S. Cl. ........................... 523/458; 252/511; 523/466
[58] Field of Search ..................................... 523/459, 466, 523/458; 252/511

[56] References Cited

U.S. PATENT DOCUMENTS

| | | | |
|---|---|---|---|
| 4,410,457 | 10/1983 | Fujimura et al. | 252/508 |
| 4,866,108 | 9/1989 | Vachon et al. | 523/428 |
| 5,030,698 | 7/1991 | Mulhaupt et al. | 525/423 |
| 5,043,102 | 8/1991 | Chen et al. | 523/428 |
| 5,367,006 | 11/1994 | Hermansen et al. | 527/428 |
| 5,385,990 | 1/1995 | Abbey et al. | 525/534 |
| 5,457,165 | 10/1995 | Hermansen et al. | 525/420.5 |
| 5,575,956 | 11/1996 | Hermansen et al. | 252/514 |

FOREIGN PATENT DOCUMENTS 6-184279  5/1994  Japan.

*Primary Examiner*—Robert E. Sellers
*Attorney, Agent, or Firm*—Colin M. Raufer; Leonard A. Alkov; Glenn H. Lenzen, Jr.

[57] ABSTRACT

A flexible, electrically-conductive, one-component epoxy adhesive composition and method for making the same are provided. The present adhesive composition comprises: (a) at least one polyepoxide resin having a hardness not exceeding a durometer Shore D reading of about 45 when cured with a stoichiometric amount of diethylene triamine; (b) a substantially stoichiometric amount of curing agent including at least one amine-terminated butadiene-acrylonitrile polymer; and (c) an electrically-conductive filler. The epoxy adhesive, upon cure, has a volume resistivity not exceeding about $10^{-3}$ ohm-cm at room temperature and a drop resistance such that a 6-mil-thick (0.015 cm) bond effected by the adhesive can withstand at least six 60-inch (152 cm) drops onto a hard surface. Optional components in the epoxy adhesive include secondary rigid and semi-rigid epoxy resins, secondary amine curing agents, non-reactive flexibilizers, diluents, and processing aids. The adhesive bonds achieved using these epoxy adhesives are non-brittle, flexible, resilient, and drop-resistant, while also exhibiting strong adhesion and good processing characteristics.

3 Claims, 3 Drawing Sheets

ADHESIVE OF EPOXY RESIN, AMINE-TERMINATED BAN AND CONDUCTIVE FILLER

This is a continuation application Ser. No. 08/664,701, filed Jun. 18, 1996, abandoned.

TECHNICAL FIELD

The present invention relates generally to compositions used as adhesives. More particularly, the present invention relates to electrically conductive, drop-resistant, flexible epoxy compositions as replacements for metallic solders.

BACKGROUND ART

The design and fabrication of electronics frequently involve bonding electronic components to circuit boards using such materials as metal solders and epoxy-based adhesives. Metal solders comprise metal alloys, such as lead-tin alloys, that may be melted at a low, near-eutectic point temperature and applied to intended adherends to achieve adhesion therebetween upon solidification by cooling. Metal solders are limited in application to joining metals together and are therefore ineffective in joining other broadly-employed materials such as plastics. Moreover, the use of lead in metal solders is undesirable, since lead is toxic and is highly regulated in use. Other disadvantages to metal solders include their use of fluxes to promote melt and flow, which must then be removed with solvents such as containing environmentally-toxic chlorofluorocarbons (CFCs), and the tendency of solder-plated traces and pads to oxidize over time, leading to potential losses in solderability.

In comparison to metal solders, epoxy-based adhesives demonstrate the ability to strongly adhere to a variety of materials, including metal, glass, plastic, wood, and fiber, and consequently are often used to bond dissimilar materials. Further, epoxy compounds are known to exhibit excellent resistance to attack by many corrosive chemicals. In contrast to metal solders, epoxy-based adhesives contain no toxic metals, require no fluxes which would require removal, and may be used on non-solder-plated traces and pads including passivated or noble metals.

Presently, electrically-conductive epoxy-based adhesives are available in two forms: two-component systems and one-component systems. Two-component epoxy-based adhesives are readily curable at room temperature but are inconvenient to use and store. The components of two-component systems must be accurately measured and properly mixed immediately prior to use. Thus, the various components to be mixed must be separately stored until use, and production workers are charged with the added responsibility of preparing epoxy-based adhesives having uniform properties. It follows that two-component epoxy-based adhesive systems are not favored.

One-component epoxy-based adhesives are available for industrial application in various forms, such as rigid epoxy adhesives, frozen pre-mix flexible epoxy adhesives, and room-temperature stable flexible epoxy adhesives. While such adhesive compositions are conveniently stored as a single component, they require curing at elevated temperatures. Rigid epoxy adhesives include such compounds as bisphenol-A epoxy resins and novolac resins. These rigid epoxy adhesives exhibit strong adhesion for many materials and may be conveniently stored at room temperature. However, rigid epoxy-based adhesives form brittle bonds that are often insufficiently pliant for bonding dissimilar materials or for withstanding mechanical shock or vibration. For example, a brittle bond between dissimilar materials with different thermal expansion rates may be unable to withstand the stresses caused by the thermal mismatch, so that both the bond and its adherends may be susceptible to failure. Bonds formed with rigid adhesives may not be sufficiently drop-resistant to withstand even relatively minor mechanical shocks, such as deriving from a drop or impact.

While flexible epoxy adhesives are available, namely as frozen pre-mix epoxy adhesives and room-temperature stable epoxy adhesives, they tend to be weak and friable. Therefore, none of these adhesives has sufficiently high elongation and tensile characteristics such that their resultant bonds withstand even relatively minor stresses when the bond surface area is small. An example of an application employing small bond areas is the interface between the component lead of fine-pitch surface mount components and the circuit trace or pad. Thus, while flexible epoxy adhesives are commercially available, their bonds remain unacceptably susceptible to failure from minor stresses, such as mechanical shock deriving from a drop or impact.

With regard to frozen pre-mix adhesives, a description of one such adhesive is found in U.S. Pat. No. 4,866,108, assigned to the same assignee as the present application, which discloses and claims a flexible epoxy adhesive comprising a mixture of a fatty acid modified epoxy resin and an oxypropylene polyether epoxy resin in the ratio of about 1:3 to 1:1. The adhesive also includes a stoichiometric amount of a polyamine curing agent, 1 to 20 total liquid weight percent of a plasticizer, 50 to 80 weight percent of aluminum oxide, and 1 to 5 weight percent of microfine silicon dioxide particles. Another frozen flexible epoxy adhesive is disclosed in U.S. Pat. No. 5,367,006, entitled "Superior Thermal Transfer Adhesive" and assigned to the same assignee as the present application, and is directed to an adhesive comprising an aliphatic epoxy resin, an aliphatic polyamine curative, a thixotropic agent, and a filler. While these frozen, pre-mix epoxy adhesives exhibit low glass transition temperatures within the range of about −10° C. to −60° C. and good adhesion, they are not electrically conductive nor do they possess the drop-resistance necessary to withstand relatively minor impacts when bond areas are small. Moreover, the adhesives of '108 contain diglycidyl ester, which is not hydrolytically stable, such that those adhesives are unsuitable for high-reliability terrestrial applications, and the adhesives of '006 contain cardonal-based resin which have unacceptably high levels of hydrolyzable chloride.

A room-temperature stable flexible epoxy adhesive that is electrically conductive is disclosed and claimed in U.S. Pat. No. 5,575,956 entitled "Room Temperature Stable, One Component, Electrically-Conductive, Flexible Epoxy Adhesives", which is assigned to the same assignee as the present application. The adhesive formulations of that application comprise an electrically-conductive filler comprising a metal and a polymer mixture comprising (i) at least one polyepoxide resin having a hardness not exceeding a durometer Shore D reading of 45 when cured with a stoichiometric amount of diethylene triamine, and (ii) a substantially stoichiometric amount of at least one latent epoxy curing agent. While this adhesive formulation exhibits low glass transition temperatures on the order of −50° C. and good adhesion, it also does not possess the drop-resistance necessary to withstand relatively minor impacts when bond areas are small.

An encapsulant composition employing epoxy resins is disclosed and claimed in U.S. Pat. No. 5,457,165, entitled "Encapsulant of Amine-Cured Epoxy Resin Blends" and assigned to the same assignee as the present application. The encapsulant comprises (a) a first liquid epoxy resin selected from the group consisting of (i) the diglycidyl ether of polyoxypropylene glycol, and (ii) the diglycidyl ester of linoleic dimer acid; (b) a second liquid epoxy resin comprising the diglycidyl ether of 1,4-butanediol present in the amount ranging between 12 to 55 parts by weight of the composition; and (c) a stoichiometric amount of an epoxy resin curing agent selected from the group consisting of a flexibilized polyamine and a flexibilized polyamide. The cured encapsulant product offers thermal and hydrolytic stability and is insulative and adhesive. However, this encapsulant composition is not electrically conductive and thus cannot serve in applications requiring this characteristic.

In sum, while various adhesives are commercially-available that offer desirable qualities such as flexibility, high elongation and tensile characteristics, strong adhesion, and electrical conductivity, none of the commercially-available adhesives offer drop-resistance. Drop-resistance is important because such commonly-handled (and therefore, commonly-dropped) devices such as telephones, calculators, and laptop computers contain components that are surface-mounted onto wiring boards with narrow bond thicknesses that may be too weak and/or too rigid to withstand drops and minor impacts.

Thus, a need remains for a flexible electrically-conductive epoxy-based adhesive exhibiting drop-resistance while retaining high elongation and tensile characteristics, resiliency, excellent adhesion, and ease of reworkability.

DISCLOSURE OF INVENTION

In accordance with the present invention, an electrically-conductive epoxy adhesive composition is provided that is flexible to low temperatures, having a glass transition temperature of less than 0° C., and that also exhibits high peel strength, high elongation characteristics, and high lap shear strength. The adhesive bonds achieved using these epoxy adhesives are therefore non-brittle, flexible, resilient, and drop-resistant across a wide temperature range, while also exhibiting strong adhesion and good processing characteristics. Accordingly, these compositions possess most, if not all, of the advantages of the prior art compositions while overcoming their above-mentioned significant disadvantages.

The one-component, flexible epoxy-based adhesives of the present invention comprise the following components: (a) at least one polyepoxide resin having a hardness not exceeding a durometer Shore D reading of about 45 when cured with a stoichiometric amount of diethylene triamine; (b) a substantially stoichiometric amount of curing agent including at least one amine-terminated butadiene-acrylonitrile polymer; and (c) an electrically-conductive filler. These epoxy-based adhesives, upon cure, have a volume resistivity not exceeding about $10^{-3}$ ohm-cm at room temperature and a drop resistance such that a 6-mil-thick (0.015 cm) bond effected by the adhesive can withstand at least six 60-inch (152 cm) drops onto a hard surface.

The polyepoxide resin component of the present compositions is a flexible epoxy resin or blend of flexible epoxy resin(s) with a more rigid epoxy resin. Flexible epoxy resins are defined here to be those epoxy resins having a durometer Shore D measurement of about 45 or less when cured with diethylene triamine (DETA). In comparison, semi-flexible epoxy resins are defined to be those epoxy resins having a durometer Shore D value ranging from about 45 to 75 when cured with DETA and rigid epoxy resins are defined as epoxy resins having a Shore D value exceeding about 75 when cured with DETA.

The epoxy resin curing agent employed to cure the polyepoxide resin is an amine-terminated butadiene-acrylonitrile polymer (ATBN) or a blend of ATBN with one or more other flexible curatives. The ATBN curing agent imparts high elongation and flexibility to the resulting epoxy adhesive. The curing agent is preferably employed in substantially stoichiometric proportion (±15%) to the epoxy resin component.

The electrically-conductive filler will typically comprise a metal such as silver, gold, or platinum and is employed at a sufficient volume percent to allow the flow of electricity through the adhesive composition. More specifically, the filler should be present in sufficient quantities such that the filler particles are within Angstrom units of one another, thereby creating pathways for electrons to travel through the adhesive composition. This typically occurs in volume percent loadings of at least about 20% of the total adhesive volume.

The adhesive of the invention is formulated by mixing the liquid components (e.g., the epoxy resin(s) and curing agent(s)) with the dry ingredients (e.g., electrically-conductive filler) until the dry ingredients are thoroughly wetted and the adhesive mixture is substantially homogenous, such as may be accomplished by a 3-roll mill. The mixture may subsequently be frozen for storage, after which it may be thawed on an as-needed basis and then cured to effect a bond.

The adhesive of the present invention is novel in providing an epoxy-based electrically-conductive composition that is flexible and exhibits high elongation and tensile characteristics and high adhesive strength. As such, the present adhesives offer strong adherence to a variety of materials as well as the flexibility and resiliency necessary to preserve the integrity of bonds having relatively small surface areas. In sum, these adhesives effect bonds that are less likely to fail in the event of such stresses as physical impacts, vibrations, and thermal cycling. The formulation of the present invention is suitable for such applications as flat pack adhesives (in film or paste form) and for filleting material (in paste form) for adhering discrete components, such as resistors, capacitors, diodes, flatpacks, etc., to a circuit board. The present formulations are particularly useful in situations in which the interface between the component lead and the circuit trace or pad represents the sole point of adhesion for interconnection. Moreover, the present adhesive formulations do not employ lead nor do they require the use of undesirable solvents for the removal of fluxes; hence, these formulations are more environmentally-friendly than traditional metal solders.

BEST MODES FOR CARRYING OUT THE INVENTION

Figure 1:
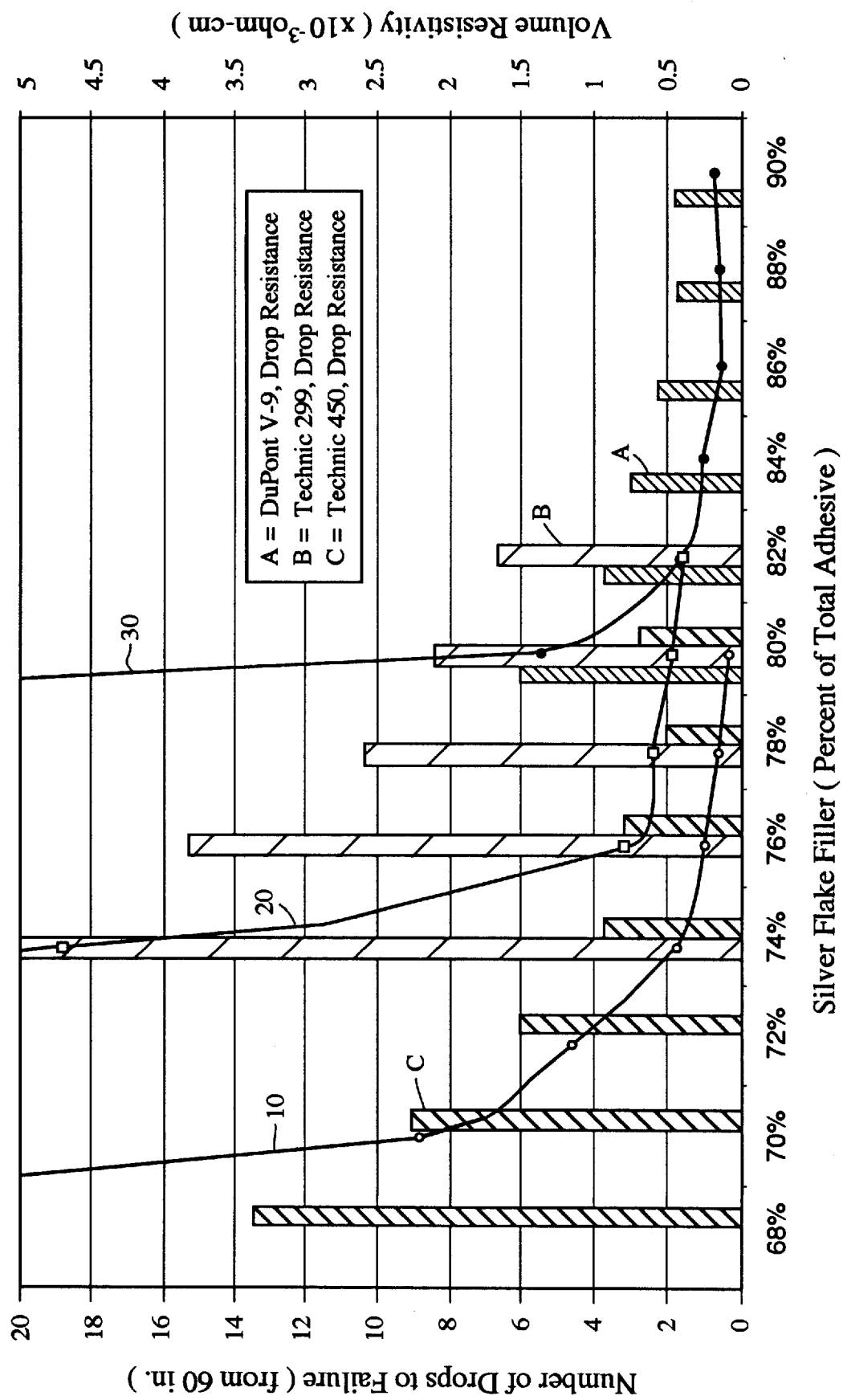
FIG. 1 is a plot of both the number of drops to failure from a 60-inch (152.4 cm) height and volume resistivity ($\times 10^{-3}$ ohm-cm) versus the concentration of silver flake filler as a percentage of the total adhesive composition, with three different silver flake fillers being represented.

The adhesive compositions of the present invention have been developed to provide industry the ability to achieve strong, reliable adhesive bonds that are resilient to various physical and environmental pressures while maintaining electrical conductivity and ease of processing. The strength and resiliency of the present adhesives is particularly useful in the event of small surface area bonds, in which case less resilient prior art adhesives tend to crack or peel.

The compositions of the present invention are based on the use of a combination of selected epoxy resins, curing agents, and fillers which will provide a flexible, electrically-conductive, drop-resistant product that is storable in an uncured state as a one-component adhesive product. More particularly, the one-component, flexible epoxy-based adhesives of the present invention comprise the following components: (a) at least one polyepoxide resin having a hardness not exceeding a durometer Shore D reading of about 45 when cured with a stoichiometric amount of diethylene triamine; (b) a substantially stoichiometric amount of curing agent including at least one amine-terminated butadiene-acrylonitrile polymer; and (c) an electrically-conductive filler. These epoxy-based adhesives, upon cure, have a volume resistivity not exceeding about $10^{-3}$ ohm-cm at room temperature and a drop resistance such that a 6-mil-thick (0.015 cm) bond effected by the adhesive can withstand at least six 60-inch (152 cm) drops onto a hard surface. The selection of the particular epoxy resins and curing agents is critical in obtaining the desired strength and resiliency in the final adhesive product.

The selection of the electrically-conductive filler and its concentration for a particular polymer system is critical in achieving both the volume resistivity requirements and the drop resistance requirements with a single adhesive composition. These two requirements have typically been considered competing goals, since the increase of filler content of an adhesive typically results in a desirable decrease in volume resistivity together with an undesirable decrease in drop-resistance. However, the present adhesive formulations satisfy both volume resistivity requirements and the drop resistance requirements at once.

The compositions of the present invention employ at least one polyepoxide resin falling within the class of so-called "flexible epoxy resins". The phrase "flexible epoxy resin" is intended to encompass epoxy resins having a durometer Shore D measurement of about 45 or less when cured with diethylene triamine (DETA). The internal flexibility exhibited by suitably flexible polyepoxide resins derives from such features as long aliphatic chains, ether and ester linkages in the polymer chains, and double carbon-carbon bonds, which increase flexibility by enhancing the rotation of adjacent single carbon-carbon bonds.

Examples of flexible polyepoxide resins that are suitably employed in the practice of the invention as primary resins include, but are not limited to, the following compounds: (1) the diglycidyl ether of polyoxypropylene glycol having an epoxy equivalent weight of about 320, as commercially available from Dow Chemical, Midland, Mich., under the trade designation DER 732; (2) the polyglycidyl ether of an aliphatic polyol, which has an epoxy equivalent weight of about 650 and is commercially available from Shell Chemical Company of Houston, Tex., under the trade designation Heloxy 84; and (3) the diglycidyl ether of 1,4-butanediol having an epoxy equivalent weight of about 130 as commercially available from Shell Chemical Co. under the trade designation Heloxy 67.

Examples of flexible polyepoxide resins that may be suitably employed in the practice of the invention as primary resins, albeit with somewhat less effectiveness than the above-enumerated flexible polyepoxide resins, include the following compounds: (1) the diglycidyl ether of neopentyl glycol having an epoxy equivalent weight of about 135 as commercially available from Shell Chemical Co. under the trade designation Heloxy 68; (2) the diglycidyl ether of cyclohexane dimethanol having an epoxy equivalent weight of about 160 as commercially available from Shell Chemical Co. under the trade designation Heloxy 107; and (3) the diglycidyl ether of polyoxypropylene glycol having an epoxy equivalent weight of about 190 as commercially available from Dow Chemical of Midland, Mich. under the trade designation DER 736.

Not all flexible polyepoxide resins may be appropriately employed in the practice of the invention. Examples of non-working flexible polyepoxide resins include the following: (1) the diglycidyl ester of linoleic dimer acid having an epoxy equivalent weight of about 430, as available from Shell Chemical Co. under the trade designation Epon 871; and (2) the polyglycidyl ether of castor oil having an epoxy equivalent weight of about 600, as available from Shell Chemical Co. under the trade designation Heloxy 505. These two classes of flexible polyepoxide resins contain ester bonds which render them hydrolytically unstable.

Although rigid polyepoxide resins are not used as a primary resin in the practice of the invention, they may be employed as secondary resins in an amount up to about 50 wt. % of the total epoxy resin component to improve certain physical characteristics of the polymer. Thus, both semi-flexible and rigid epoxy resins may comprise up to about one-half of the polyepoxide resin component. Semi-flexible epoxy resins are defined to be those epoxy resins having a durometer Shore D value ranging from about 45 to 75 when cured with DETA and rigid epoxy resins are defined as epoxy resins having a Shore D value exceeding about 75 when cured with DETA.

Semi-flexible resins are typified by adducts of bisphenol-A or -F with flexible moieties such as urethanes or carboxyl-terminated chains such as polybutadiene or butadiene-acrylonitrile copolymer or fatty polyacids such as linoleic dimer or trimer. Examples of semi-flexible epoxy resins that may serve as a secondary resin include, but are not limited to: (1) the adduct of two moles of bisphenol-A with one mole of linoleic dimer acid having an epoxy equivalent weight of about 700 as commercially available from Shell Chemical Co. under the trade designation Epon 872; (2) the carboxyl-terminated butadiene-acrylonitrile (CTBN) adduct of bisphenol-A (40% Hycar 1300×13 CTBN), as commercially available from Shell Chemical Co. under the trade designation Heloxy 58005; (3) the CTBN adduct of bisphenol-A (40% Hycar 1300X8 CTBN) as commercially available from Shell Chemical Co. under the trade designation Heloxy 58006; and (4) the aromatic urethane adduct of bisphenol-A (20% urethane) as commercially available from Shell Chemical Co. under the trade designation Heloxy 58698.

Other semi-flexible resins that may serve as secondary resins include (a) the difunctional epoxy of cardanol having an epoxy equivalent weight of about 350, as available from Cardolite Corp. of Newark, N.J., under the trade designation NC-514; and (2) the trifunctional novolac epoxy of cardanol having an epoxy equivalent weight of about 600, as available from Cardolite Corp. under the trade designation NC-547. The hydrolyzable chloride content of these particular resins is too high for use as primary resins in the present adhesive compositions.

Rigid resins are typified by diglycidyl ethers of bisphenol-A or -F, by cresol or phenol novolacs, or other polyglycidyl ethers containing primarily aromatic or cycloaliphatic ring structures. Examples of rigid epoxy resins that may be employed as secondary resins include, but are not limited to, (1) the diglycidyl ether of bisphenol-A having an epoxy equivalent weight of about 190 as commercially available from Shell Chemical Co. under the trade designation Epon 828; (2) the diglycidyl ether of bisphenol-A having an epoxy equivalent weight of about 175 as commercially available from Shell Chemical Co. under the trade designation Epon 825; (3) the diglycidyl ether of bisphenol-A having an epoxy equivalent weight of about 350 as commercially available from Shell Chemical Co. under the trade designation Epon 836; (4) the diglycidyl ether of bisphenol-F having an epoxy equivalent weight of about 170 as commercially available from Shell Chemical Co. under the trade designation Epon 862; and (5) the diglycidyl ether of bisphenol-F having an epoxy equivalent weight of about 165 as commercially available from Ciba-Geigy under the trade designation Araldite PY 306.

The preferred combination of epoxy resins employed in the practice of the invention is as follows: (1) 40 parts by weight (pbw) Epon 825; (2) 30 pbw Heloxy 67; and (3) 30 pbw DER 732, as cured using 36 pbw ATBN 1300X16 and 84 pbw DP-3680, described below.

The curing agents used in the present adhesive compositions are chosen to provide a flexible, resilient product when combined with the selected epoxy resins. The curing agent component includes an amine-terminated butadiene-acrylonitrile polymer (ATBN). The ATBN curing agent imparts high elongation, good adhesion, tear resistance, peel resistance, and low glass temperature to the final adhesive product. Examples of suitably employed ATBN curing agents include, but are not limited to, amine terminated acrylonitrile-butadiene copolymers having amine equivalent weights of about 900 and 1200 as commercially available from B. F. Goodrich Co. of Cleveland, Ohio, under the trade designations Hycar ATBN Type 1300X16 and Hycar ATBN Type 1300X21, respectively.

Although the primary curing agent is an ATBN-type curing agent in the practice of the invention, the viscosity of such curing agents, which is on the order of about 200,000 cP, is too high to be employed as the sole curing agent with most epoxy resins. The high viscosity of an ATBN is especially problematic when, as here, the adhesive composition is highly-filled with conductive fillers. Therefore, the preferred curative is a blend of ATBN with a lower-viscosity flexible amine, such as an amine-terminated polybutadiene or amine-terminated polyether. A secondary flexible amine curing agent may be employed in an amount up to about 80 wt. % of the total curing agent component to reduce the viscosity of the final adhesive composition and/or accelerate its cure. Examples of suitably employed secondary flexible amine curing agents include, but are not limited to: (1) the diprimary amine of linoleic dimer having an amine equivalent weight of about 170 as commercially available from Witco Corp. of Memphis, Tenn., under the trade designation DP-3680; (2) the diprimary, disecondary amine of linoleic dimer having an amine equivalent weight of about 140 as commercially available from Witco Corp. under the trade designation DD-3680; (3) polyether urethane polyamine having an amine equivalent weight of about 900 as commercially available from Shell Chemical Co. under the trade designation Euredur 3260; (4) accelerated polyether urethane polyamine having an amine equivalent weight of about 250 as commercially available from Shell Chemical Co. under the trade designation Euredur 3265; (5) aliphatic polyamine having an amine equivalent weight of about 250 as commercially available from Shell Chemical Co. under the trade designation Euredur 3266; and (6) poly(propyl) ether diamines having amine equivalent weights of about 60, 115, 515, 160, 225, and 675 as commercially available from Huntsman Corp. of Houston, Tex. under the respective trade designations of D-230, D-400, D-2000, ED-600, ED-900, and ED-2000.

It is noted that the viscosity characteristics of the adhesive composition as a whole must be considered in its formulation. As the adhesive is to be filled with a high loading of solid filler, the viscosity of the liquid components (i.e., epoxy resin(s), curing agent(s), plasticizer(s), diluent(s), processing aid(s), etc.) must be sufficiently low such that the filled paste adhesive is not too thick to be processed by conventional means. This is especially apropos since the most conductive fillers are high in surface area, therefore requiring substantial liquid to wet their surface. Thus, the viscosity of the combination of liquid components must be less than about 10,000 cP at 23° C. The combination of constituents is therefore chosen with strict regard to the viscosity of the liquids portion of the adhesive, as well as for the physical characteristics of the cured adhesive. Thus, the difficulty of using ATBN as the sole primary curing agent becomes even more apparent when its high viscosity of about 200,000 cP and relatively high equivalent weight (e.g., 900) are considered: if employed as the sole curing agent it must be used with a low-viscosity resin of high equivalent weight.

The preferred combination of curing agents employed in the practice of the invention is ATBN 1300X16 and DP-3680 at the respective concentrations of 30 pbw to 70 pbw.

The amount of curing agent is preferably in stoichiometric proportion relative to the epoxy resin employed. In general, the amount of curing agent may be varied about ±15 percent from stoichiometry, with little adverse effect on the final product. The severity of adverse effects deriving from employing more or less than the exact stoichiometric amount of curing agent depends upon the functionality of the ingredients employed (e.g., trifunctional epoxy resins fare better than difunctional epoxy resins) and the cure temperatures employed (e.g., resins cured at higher temperatures fare better than those cured at lower temperatures).

The filler component serves to render the present adhesive compositions electrically conductive. To achieve electrical conductivity, the filler must be incorporated to such an extent that the filler particles are within a few Angstrom units from one another, thereby forming pathways for electron travel. Until the filler concentration reaches this critical level, the volume resistivity of the adhesive composition will remain high (e.g., on the order of $10^{12}$ ohm-cm) and its electrical conductivity will remain negligible. Once the critical filler concentration level is reached, the adhesive composition, once cured, will exhibit a volume resistivity less than about $10^{-3}$ ohm-cm at room temperature. The critical filler concentration is generally reached at about 20 to 30 vol. %. It is noted that the critical filler concentration is higher if fillers consisting of spherical particles are employed than if fillers consisting of particles having higher aspect ratios are employed, such as flakes and rods. Since different fillers have different densities, the critical weight percent for a particular filler will vary but may be roughly calculated knowing the critical volume percent.

It is noted that so-called conductive adhesives are typically not conductive until after cure. Most conductive fillers, particularly metal flake types, are coated with an organic material to prevent agglomeration during milling and storage prior to use. In the case of silver flakes, this coating is usually a fatty acid (e.g., stearic acid). In order for the adhesive to achieve good conductivity, it must be able to dissolve the coating thoroughly, either before or, more usually, during cure. Since the solution phenomenon usually takes place at temperatures above about 120° C., it therefore follows that most conductive adhesives are not conductive until after cure.

The electrically-conductive filler component may comprise any metal and may take such forms as metal powder, metal flakes, or non-metal particles having a metal outer coating. Preferably, a noble metal is employed to achieve longer term retention of electrical conductivity. Examples of noble metals suitably employed in the practice of the invention include gold, silver, platinum, nickel, and palladium. Examples of particles having a metal outer coating that are acceptable in the practice of the invention include silver-plated copper beads, such as commercially available from Potters under the trade designations SC500P18 and SC140F19U; silver-plated glass beads, such as commercially available from Potters under the trade designations SH400S33 and S5000S3; silver-plated copper flakes, and silver-plated mica flakes, such as commercially available from Potters under the trade designation SM140F65. Preferably, about 60 to 80 wt. % of silver powder, such as available from Technic under the trade designation Silflake 299 (also known as Technic 95-299), is employed as the filler component in the practice of the invention. Additional commercial sources of suitably-employed silver flakes include DuPont and DeGussa.

Optionally, the composition of the present invention includes non-reactive flexibilizers, preferably not exceeding 50 wt. % of the total liquids in the adhesive, to improve processing properties such as viscosity or substrate wetting. In general, flexibilizers effectively increase the liquid content of the adhesive composition, thereby allowing greater addition of electrically-conductive filler to the adhesive composition so that reaching the critical filler concentration level is ensured. In particular, non-reactive flexibilizers act as external plasticizers which do not chemically attach to the polymer network but are retained in the network due to van der Waals attraction and/or hydrogen bonding. Consequently, they must have a chemical structure compatible with the epoxy/curative structure in order not to be expelled. Plasticizers with high molecular weights are desirable, since the increased chain entanglement between plasticizer and the epoxy/curative structure serves to decrease migration of the plasticizer. Simple experimentation to determine compatible plasticizers, such as by preparing a polymer and proposed plasticizer and observing whether compatibility exists, may be done. Such experimentation is considered to be a routine endeavor that is well within the capabilities of those having ordinary skill in the art and is not considered to be undue. Polyols having molecular weights of at least 1,000 and triols with molecular weights ranging from 1,500 to 6,000 are commonly employed as non-reactive flexibilizers. Examples of high molecular weight triols suitably employed in the practice of the invention include high molecular weight poly (oxypropylene)triol (available from Union Carbide, Danbury, Conn., under the trade designation LHT-28) and hydroxyl-terminated polybutadiene (available from Atochem, under the trade designation Poly BD R45HT), with the latter being a flexibilizer of preference in the practice of the present invention. Other examples of suitable non-reactive flexibilizers include phthalate esters, adipate esters, and methyl lineolate, such as Epodil ML.

The adhesive composition may also optionally include a diluent component. The diluent may comprise any monofunctional material (i.e., having one epoxide group per molecule) that reduces viscosity. The diluent may comprise any of the well-known materials for this purpose, and may include flexibilizing diluents such as alkyl glycidyl ethers (e.g., Heloxy 7, 8, and 9 commercially available from Shell Chemical Co. having respective equivalent weights of about 227, 290, and 285) and glycidyl ethers of alkyl phenols such as nonyl phenol or cardanol. Simple experimentation will readily determine the appropriate amount of diluent in the adhesive composition. The scope of experimentation required to determine the proper concentration of diluent is considered to be reasonable for those having ordinary skill in the art and is not considered to be undue.

Other optional additives to the present flexible epoxy adhesive composition include UV stabilizers, antioxidants, thixotropic agents, and various other processing aids such as wetting agents, anti-foaming agents, and dispersing agents, all of which are known and commonly used in the art. A thixotropic agent, if employed, would preferably be a fine, high surface area conductive powder such as Degussa's Silver Flake #50-S, which has a surface area of about 3.5 to 6 $m^2$/g. An example of a suitably-employed wetting agent is isopropyl, tridodecylbenzenesulfenyl titanate, such as commercially available under the trade designation Titanate Kenrich KR-95. The processing aids are preferably employed at a concentration of up to about 5 wt. % of the total adhesive composition.

The adhesive of the invention is formulated by first manually mixing the liquid components (i.e., the epoxy resins, curing agents, non-reactive flexibilizers, and diluents, if any) with the dry ingredients (i.e., fillers, and processing aids) in their appropriate concentrations until the dry ingredients are thoroughly wetted. Preferably, the dry ingredients are milled into the liquid ingredients, for example, using a 3-roll mill. Milling achieves optimal wetting of the filler so that the resulting adhesive is uniform in composition and therefore exhibits higher overall quality. In the alternative, one may separately combine (1) the epoxy resin(s) with only a proportional amount of filler and (2) the curative(s) with the remaining filler, each by 3-roll mill, then combine these two separate combinations in the next processing step. By separately filling the epoxy resin(s) and curative(s), one prolongs the working life of the adhesive, since the two filled components remain inert until they are combined in the next processing step. At any rate, by performing this initial mixing step, one avoids taking abrasives into the vacuum pump employed in the next processing step.

The wetted mass (or, alternatively, two filled components) is then weighed and transferred into the mixing vessel of a vacuum mixer. Mixing under vacuum pressure ensures that no air or moisture is entrained in the finished paste. An example of a suitable vacuum mixer is a Ross Double Planetary Mixer, Model 130, available from Charles Ross & Son Company (Happauge, N.Y.). After sealing and evacuating the mixer, the paste is mixed for a period of time at 0.25 Torr or less, using a cooling jacket if necessary to offset the heat of friction and to thereby maintain the temperature of the paste at about 23 to 25° C. For a 2 kg batch, about 20 to 30 minutes of mixing are required to achieve a substantially homogenous mixture.

After the vacuum mixing is completed, the paste is dispensed into pre-labeled cartridges of syringes, which are then quick-frozen in dry ice and then stored at −40° F. (−40° C.) until needed.

The normal usage of this adhesive material is as a replacement for solder paste. In such an application, the adhesive would be applied in a thin film, i.e., 0.003 in. to 0.010 in. (0.0076 cm.–0.0254 cm.), over conductive pads or traces in a pattern corresponding to the leads of the components to be bonded. This is accomplished by stenciling or screening.

An adhesive film of the composition of the invention may also be made by the following well-known process. To make a panel 12 inches ×42 inches (30.5 cm ×106.7 cm):

(a) Thaw a 6 ounce (177.4 cm$^3$) cartridge of paste adhesive.

(b) Lay out 84 inches (213.4 cm) of 3-mil (0.076 mm) thick, 12 inch (30.5 cm) wide plastic or plastic-coated release film, fold in half, and crease to make 42 inch (106.7 cm) long doubled panel.

(c) Lay out and cut 42 inch (106.7 cm) length of 2-mil (0.051 mm) thick, 12 inch (30.5 cm) wide, epoxy-sized glass cloth or metal mesh between layers of release film with one end in the crease of the release film.

(d) Clamp crease end of cloth/release film panel in pulling bar of film coater. Feed loose end of cloth/release film panel between drawplate and drawblade and install pulling bar at start position. Adjust starting position, if necessary, using motor.

(e) Set drawblade gap for the desired film thickness plus thickness of both layers of release film.

(f) Fold top layer of release film and glass cloth over the drawblade to expose bottom layer of release film. Dispense about 75 cm$^3$ of paste along drawblade, between the glass cloth and the bottom layer of release film in a uniform bead. Fold the glass cloth over the paste and dispense another 75 cm$^3$ uniform bead of paste along the drawblade, between the glass cloth and the top layer of release film. (The amount of 75 cm$^3$ beads is based on 15-mil, or 0.38 mm, film thickness.)

(g) Start the motor and adjust the pulling speed to optimum. Depending on paste viscosity and film thickness, optimum speed will probably be about 5 to 10 inch/minute (12.7 to 25.4 cm/minute).

(h) Be prepared to redistribute paste to maintain uniformity of paste beads, to add more paste if required, and to stop pulling in the event of a jam or catch in the film being pulled.

(i) When entire panel is coated, inspect for voids in the film adhesive, and cut into the required sheet sizes.

(j) Package film adhesive sheets between cardboard backboards, with layers of kraft paper between the adhesive sheets. Seal into a zip-seal bag and then place in a heat-sealable, foil-lined, moisture-barrier bag and store in freezer at −40° F. (−40° C.).

In order to use the present frozen adhesive formulation in frozen film form, one first removes the adhesive from cold storage to allow it to thaw out. Once thawed, the present adhesive formulations offer a worklife in excess of eight hours, so that the present formulations are suitable for automated bonding operations. The thawed adhesive formulation is then placed in contact with the materials to be bonded in the manner desired for adhesion. Then, the adhesive formulation is cured by heating both the materials to be bonded and the inserted adhesive formulation to an elevated cure temperature. While a cure temperature as a high as 175° C. may be employed depending upon the particular electronics application, the present adhesive compositions are typically curable at about 150° C. or less (i.e., as low as about 120° C.). While cure times vary with the particular composition of the adhesive, the cure time for the adhesives of the present invention is contemplated to be less than about 1 hour at 150° C. Upon cure, the present adhesive composition forms a strong, flexible, resilient bond between the materials that remains flexible down to a glass transition temperature $T_g$ as low as minus 25° C., with the precise minimum $T_g$ depending upon the formulation of the adhesive.

EXAMPLES

Examples 1–18 represent adhesive compositions tested to illustrate the volume resistivity and drop resistance characteristics achieved in the practice of the invention, with the formulations of Examples 1–18 being reported in Tables 1 and 3 below. These adhesives were formulated by combining the liquid epoxy resins and the curing agents with the filler and milling them together in a 3-roll mill with the gap between the rollers set at about 0.001 to 0.002 in. (0.0025 to 0.005 cm). The mixture was passed through the mill 3 to 5 times to produce a smooth, homogenous paste. The 3-roll mill was a Type FSE from W. R. Fritsch of Louisville, Ky. Vacuum mixing was done in a Mod. 130 Planetary vacuum mixer from Ross & Son Co. of Happauge, N.Y. The milling and vacuum mixing were done at room temperature. In each case, the blended mixture was thereafter applied to two adherends and cured at 150° C. for about one hour.

Various properties were measured for each of the example adhesive formulations, including testing for pass/fail criteria for drop-testing and volume resistivity. Some formulations were also tested for lap shear strength, tear resistance, 90° peel, resilience, and hydrolytic and thermal stability. For all of the measurements except drop-testing, a five-mil-thick (0.013 cm) bond representing each of the adhesive formulations was tested, with the adhesive bonding together conductive substrates. Each of the measurements were made in accordance with the below-listed specifications, wherein "ASTM" denotes the American Society for Test and Materials:

| Measurement | Specific ASTM Followed |
| --- | --- |
| Volume Resistivity | ASTM D257 |
| Lap Shear Strength | ASTM D1002 |
| Tear Resistance | ASTM D1004 |
| 90° Peel Strength | ASTM D3167 |
| Drop Resistance | Test Procedure Described Below |
| Resilience | Subjective Evaluation of Rebound from Deformation |

Additionally, the hydrolytic stability represents the lap shear strength after 48 hours at 250° F. (121° C.) and 15 PSIG (0 atm) steam (autoclave). The thermal stability represents the lap shear strength after 168 hours at 125° C. in dry heat.

With regard to the drop testing, each of the example adhesive formulations was used to bond together the leads of a 44-I/O J-leaded PLCC (plastic, leaded chip carrier) to a copper-clad polyimide PWB using a bond having a thickness of about 6 mils (0.015 cm). More specifically, the substrate was a strip of laminated polyimide approximately 0.060 in. (0.152 cm) ×1.00 in. (2.54 cm) ×6.00 in. (15.24 cm) with about 1–2 oz. (31–62 g.) of copper on both sides. The substrate was cleaned with acetone or isopropyl alcohol, after which the adhesive formulations were applied to the substrates using an adhesive spreading blade to a thickness of about 6–7 mils (0.015–0.018 cm), into which three J-lead components were placed. The samples were then cured. Each cured test specimen was dropped from a height of five feet (152 cm) onto an asphalt-tiled concrete floor. Drop resistance was determined by the number of drops sustained prior to the bonded component being dislodged from the coupon. Tables 1 and 3 report the average number of drops to failure for the three J-lead components on each substrate coupon. Adhesive formulations were considered to "pass" this test if all three of the components remained attached to the substrate after six drops.

Essentially, Table 1 compares the drop resistance of various eight formulations with the physical properties presumed in advance to have a bearing on the ability of these adhesives to withstand the high transient shock of the drop test.

15,000 cP) was loaded at high level with fine conductive powder, thereby resulting in a filled paste that was too thick for application. Formulation nos. 3 and 4 were formulated in accordance with the invention and their associated filler was tailored to provide the requisite volume resistivity without rendering an unacceptably-low drop resistance. Formulation nos. 5 and 8 failed to employ an ATBN-type curing agent and were thus formulated outside of the scope of the invention; therefore, the poor drop resistance values for these formulations resulted as expected.

Formulation nos. 6 and 7 exhibited acceptable volume resistivities and drop resistance characteristics. These adhe-

TABLE 1

Physical Performances of Various Conductive Flexible Epoxy Adhesive Formulations

| No. | Formulation (parts by wt) | | Volume Resistivity, ohm-cm @ 23° C. | Lap Shear Strength psi (kg/cm²)[1] | Tear Resistance lb/in (kg/cm) | 90° Peel Strength lb/in (g/cm) | Drop Resistance 60-in. ht. (ave. of 3) | Hydrolytic Stability | Resilience (Ability to Recover from Deformation) | Thermal Stability (Aged at 150° C.) |
|---|---|---|---|---|---|---|---|---|---|---|
| 1 | Heloxy 505: ATBN 1300X16: DuPont V-9: | 8 12 80 | $3.1 \times 10^{-3}$ | 220 (15.5) | 40 (7.1) | 3.2 (581) | 6.0 | reverts (failure) | excellent | fair |
| 2 | Heloxy 84: ATBN 1300X16: Humko DP-3680: DuPont V-9: | 12.7 4.8 2.5 80 | $3.9 \times 10^{-3}$ | 250 (17.6) | 46 (8.2) | 3.7 (661) | 4.2 | good | excellent | fair |
| 3 | DER 732: Epon 828: ATBN 1300X16: Humko DP-3680: DuPont V-9: | 6.7 6.7 4.4 2.2 80 | $1.4 \times 10^{-3}$ | 425 (29.9) | 150 (26.8) | 7.2 (1286) | 6.5 | good | good | good |
| 4 | Heloxy 84: ATBN 1300X16: Epodil ML: DuPont V-9: | 5.9 8.2 5.9 80 | $4.0 \times 10^{-3}$ | 400 (28.1) | 56 (10.0) | 2.9 (525) | 26.7 | good | excellent | poor (large weight loss) |
| 5 | Heloxy 84: Euredur 3266: DuPont V-9: | 14.3 5.7 80 | $5.8 \times 10^{-3}$ | 144 (10.1) | 34.2 (6.1) | 2 (357) | 1.8 | good | poor | poor |
| 6 | Heloxy 67: Jeffamine D2000[2]: Humko DP-3680: DuPont V-9: | 6.6 6.7 6.7 80 | $1.8 \times 10^{-3}$ | 312 (21.8) | 61 (10.9) | 3.7 (659) | 8.7 | fair | good | poor |
| 7 | Heloxy 67: Polamine 650[3]: Humko DP-3680: DuPont V-9: | 8 5.3 6.7 80 | $3.8 \times 10^{-3}$ | 339 (23.9) | 82 (14.6) | 5.2 (929) | 9.7 | good | fair | fair |
| 8 | Epon 825: TETA: DuPont V-9: | 17.5 2.5 80 | $4.8 \times 10^{-3}$ | 520 (36.5) | 14 (2.5) | 0.9 (160) | 1 | poor | good | excellent |

[1]Aluminum-Aluminum
[2]Diprimary amine-terminated poly(oxypropylene) polyether having an equivalent weight of about 525, a molecular weight of about 2,000, and commercially available under the Jeffamine 2000 trade designation from Huntsman Corp.
[3]Polyethylether terminated with an aromatic primary amine at each end, commercially available under the trade designation Polamine 650 from Airco as a co-curative in urethane-polyurea systems.

Of the example formulations presented in Table 1, only Formulation nos. 3–4 and 6–7 resulted in acceptable volume resistivities and drop resistance characteristics, while Formulation nos. 1–2, 5 and 8 exhibited poor drop resistance.

More specifically, Formulation no. 1 exhibited an acceptable volume resistivity and drop resistance, but had poor hydrolytic stability given its use of Heloxy 505 as the sole epoxy resin, which contains problematic ester bonds. Formulation no. 2 exhibited less-than-acceptable drop resistance even though it employed components within the scope of the invention, illustrating the importance of tailoring the filler to the particular epoxy polymer system. Specifically, Formulation no. 2 exhibited an unacceptably high viscosity because the high-viscosity unfilled resin system (about sives were formulated outside of the scope of the invention, employing Jeffamine 2000 and Polamine 650 as co-curatives with Humko DP-3680, with the Jeffamine 2000 and Polamine 650 employed to pre-react with the Heloxy 67 resin to form epoxy-terminated prepolymers which were then cured with Humko DP-3680. These formulations did not exhibit the same qualities as formulations within the scope of the invention, e.g., both good hydrolytic stability and resilience.

A review of the various physical properties of Table 1 revealed no clear correlation between any of the properties and a corresponding value or trend in drop resistance. With regard to lap shear strength, example formulation nos. 3 and 4 have substantially equal lap shear values and yet vary widely in their drop resistance. Further, example formulation no. 8 has the highest lap shear value and the worst drop resistance, with this formulation being an example of a rigid as well as the resulting volume resistivity of the adhesive formulation.

TABLE 2

Physical Properties of Various Conductive Fillers and the Volume Resistivity of the Adhesive Formulation

| Filler | Supplier | Particle Type | Average particle size ($\mu$m) | Surface Area ($m^2/g$) | Specific Gravity (g/cc) | Tap Density (g/cc) | Loading Level Percent by weight | Loading Level Percent by volume | Volume Resistivity, ohm-cm @ 23° C. |
|---|---|---|---|---|---|---|---|---|---|
| V-9 | DuPont | Silver Flake | 3 | 0.75–1.35 | 10.5 | >2.5 | 80 | 29.5 | $1.4 \times 10^{-3}$ |
| SC500P18 | Potters | Silver-coated Copper | 22 | not listed | 9.1 | 2.2 | 80 | 32.5 | >100 |
| SC140F19U | Potters | Silver-coated Copper | 1.4 | 0.61 | 9.1 | 1.1 | 80 | 32.5 | 45 |
| SH400S33 | Potters | Silver-coated glass spheres | 15 | not listed | 1.4 | not listed | 50 | 44 | >100 |
| S500S3 | Potters | Silver-coated glass spheres | 12 | not listed | 2.7 | 0.9 | 65 | 46 | >100 |
| SM140F65 | Potters | silver-coated mica | 50 | not listed | 4.8 | not listed | 75 | 40.7 | >100 |
| 9a1 | Degussa | silver flake | 7.5 | 0.70–1.30 | 10.5 | 3.4 | 80 | 29.5 | >100 |
| 261v | Degussa | silver flake | 3.7 | 0.08–0.30 | 10.5 | 5.0 | 80 | 29.5 | 20.5 |
| 52 | Degussa | silver flake | 1.4 | 0.30–0.70 | 10.5 | 4.1 | 80 | 29.5 | >100 |
| 80 | Degussa | silver flake | not listed | 0.40–0.70 | 10.5 | 4.1 | 80 | 29.5 | >100 |
| 95 | Degussa | silver flake | not listed | 0.8–1.2 | 10.5 | 4.0 | 80 | 29.5 | >100 |
| 237 | Technic | silver flake | not listed | 0.6–1.2 | 10.5 | 3.2 | 80 | 29.5 | $3.2 \times 10^{-3}$ |
| 282 | Technic | silver flake | not listed | 0.60–1.0 | 10.5 | 3.2 | 80 | 29.5 | $1.3 \times 10^{-3}$ |
| 299 | Technic | silver flake | not listed | 0.30–0.80 | 10.5 | 3.5 | 80 | 29.5 | $0.6 \times 10^{-3}$ |
| 450 | Technic | silver flake | not listed | 0.6–1.2 | 10.5 | 2.4 | 80 | 29.5 | $0.2 \times 10^{-3}$ |
| 499 | Technic | silver flake | not listed | 0.5 | 10.5 | 4.2 | 80 | 29.5 | >100 | conductive epoxy having poor peel strength and tear resistance in spite of high lap shear. In sum, there is no apparent direct relation between lap shear strength and drop resistance. Likewise, a review of the tear resistance and peel strength indicates no apparent direct relation between these physical properties and drop resistance. It is therefore concluded that drop resistance is a complex combination of adhesion, cohesive strength, and resilience (i.e., the ability to absorb and dissipate the high transient loads incurred upon dropping).

The volume resistivity values reported in Table 1 illustrate the importance of tailoring the filler and its concentration for the particular adhesive formulation. Although all of the formulations in Table 1 were loaded with the same filler to the same extent, each of the formulations had a very different volume resistivity. This is illustrated in FIG. 1, in which the same polymer system (specifically, Formulation no. 3 from Table 1) was loaded with three different silver flakes, namely DuPont V-9, Technic 299, and Technic 450. The critical point at which the filled adhesive went from nonconductive to conductive and the range of high conductivity (i.e., low resistivity) is different for all three fillers. More specifically, the bars illustrate the decreasing drop resistance for each adhesive formulation with an increase in silver flake filler content, while Curves 10, 20, and 30 illustrate the decrease in volume resistivity for Technic 450, Technic 299, and DuPont V-9, respectively, given an increase in silver flake filler content.

To further illustrate the differences in the behaviors attainable from different fillers, the polymer system of Formulation no. 3 in Table 1 was loaded with different fillers. More specifically, the adhesive formulation contained 50 pbw DER 732, 50 pbw Epon 828, 33 pbw ATBN 1300X16, and 17 pbw Humko DP-3680. Table 2 below reports the physical characteristics of the various fillers added to this formulation The volume resistivities of the adhesive formulations in Table 2 varied widely, even among silver flakes loaded at the same level. This again illustrates the necessity for compatibility between the filler and the specific polymer system. The critical loading level at which conductivity is achieved was not determined for each of the fillers, but experience has shown that at levels above 40 vol. % (or 80 wt. % for silver flakes), the drop resistance deteriorates. The irregular shape and wide variance in particle size in these silver flake fillers do not lend themselves to mathematical modeling for filler load optimization, as would spheres or rods. Therefore, the best specific filler and its optimum loading must be derived empirically once the polymer system with the best physical and processing properties has been selected.

It is noted that the differences between various types of silver flakes such as available from Degussa or Technic include particle size, particle shape, milling method, coating composition, surface area per gram, bulk density, tap density, and other parameters, not all of which are disclosed or known. Therefore, silver flakes which might appear quite similar by their specifications may exhibit widely different values in actual practice. An example is DuPont's V-9 as compared to Degussa's 9al: although very similar in specification, their resulting conductivity effects when employed in the present adhesives are quite different, as demonstrated in Table 2. It follows that choice of filler and filler concentration remains an empirical process.

Table 3 below further illustrates the importance of empirically determining filler compatibility with a particular polymer system as well as the lack of correlation between drop resistance and any single physical property of the polymer system.

TABLE 3

Electrical, Drop Resistance, and Processing Properties of Various Flexible Epoxy Conductive Adhesives

| No. | Formulation | pbw | Volume Resistivity, ohm-cm @ 23° C. | Drop Resistance 60-in. ht. (ave. of 3) | Worklife (Time to reach 1000 Poise) | Cure Time at 150° C. |
|---|---|---|---|---|---|---|
| 9 | DER 732 | 7.3 | | | | |
|   | Epon 828 | 7.3 | $0.97 \times 10^{-3}$ | 8.3 | 2.6 hrs. | 30 min. |
|   | ATBN 1300X16 | 4.9 | | | | |
|   | Humko DP-3680 | 2.5 | | | | |
|   | Technic 299 | 78 | | | | |
| 10 | Heloxy 84 | 5.9 | | | | |
|    | ATBN 1300X16 | 8.2 | $1.7 \times 10^{-3}$ | 11 | 2 hrs. | 30 min. |
|    | Epodil ML | 5.9 | | | | |
|    | Technic 299 | 78 | | | | |
| 11 | Heloxy 84 | 6.5 | | | | |
|    | Epodil ML | 1.3 | $>10^6$ | 5.7 | 3.5 hrs. | 30 min. |
|    | PolyBD R45Ht | 5.2 | | | | |
|    | ATBN 1300X16 | 9.0 | | | | |
|    | Technic 299 | 78 | | | | |
| 12 | Heloxy 67 | 8.8 | | | | |
|    | ATBN 1300X16 | 2 | $1.0 \times 10^{-3}$ | 6 | 10 hrs. | 5 min. |
|    | Humko Dp-3680 | 11.2 | | | | |
|    | Technic 299 | 78 | | | | |
| 13 | Denalex R45EPT[1] | 11.0 | | | | |
|    | Epon 825 | 3.4 | $1.2 \times 10^{-3}$ | 3 | 1.1 hrs. | 30 min. |
|    | Heloxy 8 | 1 | | | | |
|    | Epodil ML | 1.6 | | | | |
|    | Humko DP-3680 | 5 | | | | |
|    | Technic 299 | 78 | | | | |
| 14 | Denalex R45EPT | 11.4 | | | | |
|    | Heloxy 67 | 3.3 | $2.2 \times 10^{-3}$ | 3 | 3 hrs. | 20 min. |
|    | Epodil ML | 1.6 | | | | |
|    | Humko DP-3680 | 5.7 | | | | |
|    | Technic 299 | 78 | | | | |
| 15 | Epon 828 | 3.6 | | | | |
|    | Heloxy 67 | 3.7 | $0.84 \times 10^{-3}$ | 12.7 | 6.5 hrs. | 10 min. |
|    | DER 732 | 3.7 | | | | |
|    | ATBN 1300X16 | 1.6 | | | | |
|    | Humko DP-3680 | 9.4 | | | | |
|    | Technic 299 | 78 | | | | |
| 16 | Epon 828 | 5.4 | | | | |
|    | Heloxy 67 | 2.8 | $0.74 \times 10^{-3}$ | 13.3 | 5 hrs. | 10 min. |
|    | DER 732 | 2.8 | | | | |
|    | ATBN 1300X16 | 1.6 | | | | |
|    | Humko DP-3680 | 9.4 | | | | |
|    | Technic 299 | 78 | | | | |
| 17 | Epon 828 | 7.2 | | | | |
|    | Heloxy 67 | 1.9 | $0.79 \times 10^{-3}$ | 6 | 3.6 hrs. | 10 min. |
|    | DER 732 | 1.9 | | | | |
|    | ATBN 1300X16 | 1.6 | | | | |
|    | Humko DP-3680 | 9.4 | | | | |
|    | Technic 299 | 78 | | | | |
| 18 | DER 732 | 7.3 | | | | |
|    | Epon 828 | 7.3 | $4.6 \times 10^{-3}$ | 6 | 11.5 hrs. | 150 min. |
|    | ATBN 1300X16 | 5.2 | | | | |
|    | Methane Diamine | 2.2 | | | | |
|    | Technic 299 | 78 | | | | |

[1]Epoxy-terminated polybutadiene having an equivalent weight of about 1600 and commercially available under the trade designation Denalex R45EPT from Nagase Chemicals of Tokyo, Japan.

Of the example formulations presented in Table 3, Formulation nos. 9–10, 12, and 15–18 resulted in acceptable volume resistivities and drop resistance characteristics, while Formulation nos. 11 and 13–14 exhibited poor drop resistance.

More specifically, Formulation nos. 9 and 10 are comparable to Formulation nos. 3 and 4, respectively, of Table 1. However, Formulation nos. 9 and 10 employed Technic 299 silver filler, while Formulation nos. 3 and 4 employed DuPont's V-9 silver filler, thereby illustrating that the volume resistivities and drop resistance characteristics of these adhesive formulations change in accordance with the choice of filler. Formulation no. 11 exhibited an unacceptably high volume resistivity and low drop resistance, although it differs from Formulation no. 10 only in the replacement of a majority of Epodil ML with PolyBD R45HT. Thus, the choice of filler must also be compatible with the plasticizer selected. Formulation no. 12 represents a working formulation within the scope of the invention, thereby achieving acceptable volume resistivity and drop resistance characteristics. Formulation nos. 13 and 14 failed to employ an ATBN curing agent, instead employing Humko DP-3680 alone, therefore failing to achieve sufficient drop resistance. Further, Denalex R45EPT is not commercially-available in the United States because it is not TSCA-approved. Formulation nos. 15–17 employed the preferred polymer system and accordingly achieved acceptable volume resistivity and drop resistance characteristics. Finally, Formulation no. 18 achieved acceptable volume resistivity and drop resistance characteristics despite substituting an amine diluent (methane diamine) for the DP-3680 preferably employed in Formulation no. 9, although the volume resistivities and drop resistance values were somewhat sacrificed as a result.

Figure 2:
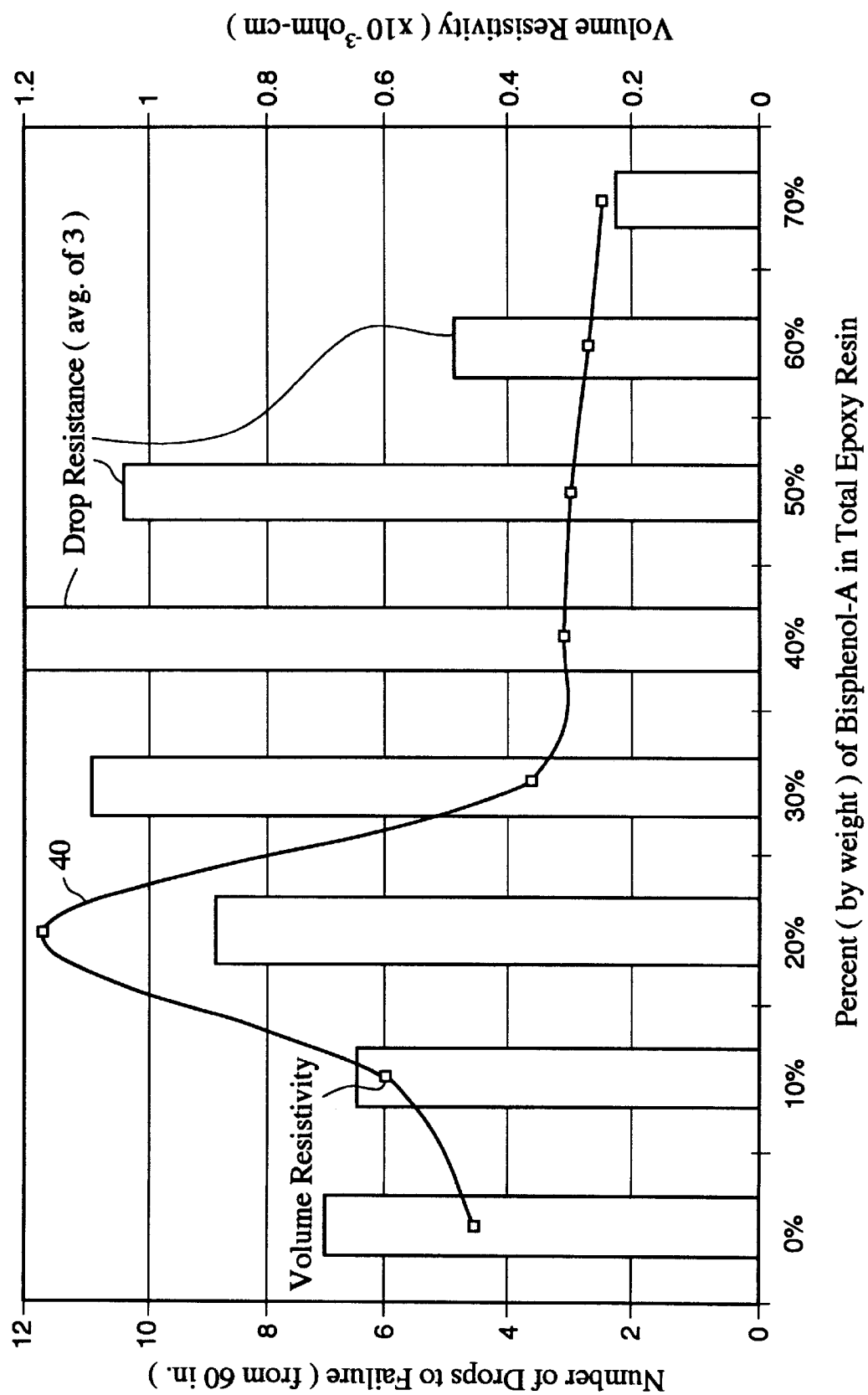
FIG. 2 is a plot of both the number of drops to failure from a 60-inch (152.4 cm) height and volume resistivity ($\times 10^{-3}$ ohm-cm) versus the weight percent of bisphenol-A in the total epoxy resin composition.

Curve 40 of FIG. 2 illustrates how the amount of rigid epoxy resin (namely bisphenol-A type resins) improves and, beyond a certain concentration, degrades drop resistance. Specifically, the epoxy resin system of FIG. 2 is given by the following formula:

N wt. % Epon 825+(100-N wt. %) flexible resin

Specifically, the flexible resin consisted of 50 wt. % Heloxy 67 (equivalent weight about 127) and 50 wt. % DER 732 (equivalent weight about 320). The curing agent for the epoxy resin system of FIG. 2 was 85 wt. % Humko DP-3680 and 15 wt. % ATBN 1300X16, and the filler, expressed as a percentage of the total adhesive composition, was 78 wt. % Technic 299. In each formulation, 50 wt. % of the liquid components of the adhesive (i.e., curing agents and epoxy resins) comprised the curing agent and 50 wt. % comprised the epoxy resin system. For example, for the epoxy resin system containing 30 wt. % Epon 825, the total formulation was as follows: 78 wt. % conductive adhesive and 22 wt. % liquid adhesive components, with the liquid adhesive components specifically comprising 15 wt. % Epon 825 (30 wt. % of total epoxy resin); 17.5 wt. % Heloxy 67 (35 wt. % of total epoxy resin); 17.5 wt. % DER 732 (35 wt. % of total epoxy resin); 42.5 wt. % DP-3680 (85 wt. % of total curing agent), and 7.5 wt. % ATBN 1300×16 (15 wt. % of total curing agent).

Curve 40 indicates that the volume resistivity of the adhesive composition increases until the content of rigid resin reached about 20 wt. %, after which the volume resistivity plunges, thereby indicating an alteration in filler compatibility with the epoxy system given excessive rigid resin. The bars illustrate that the drop resistance increased until the content of rigid resin reached about 40 wt. %, after which the drop resistance decreased.

Figure 3:
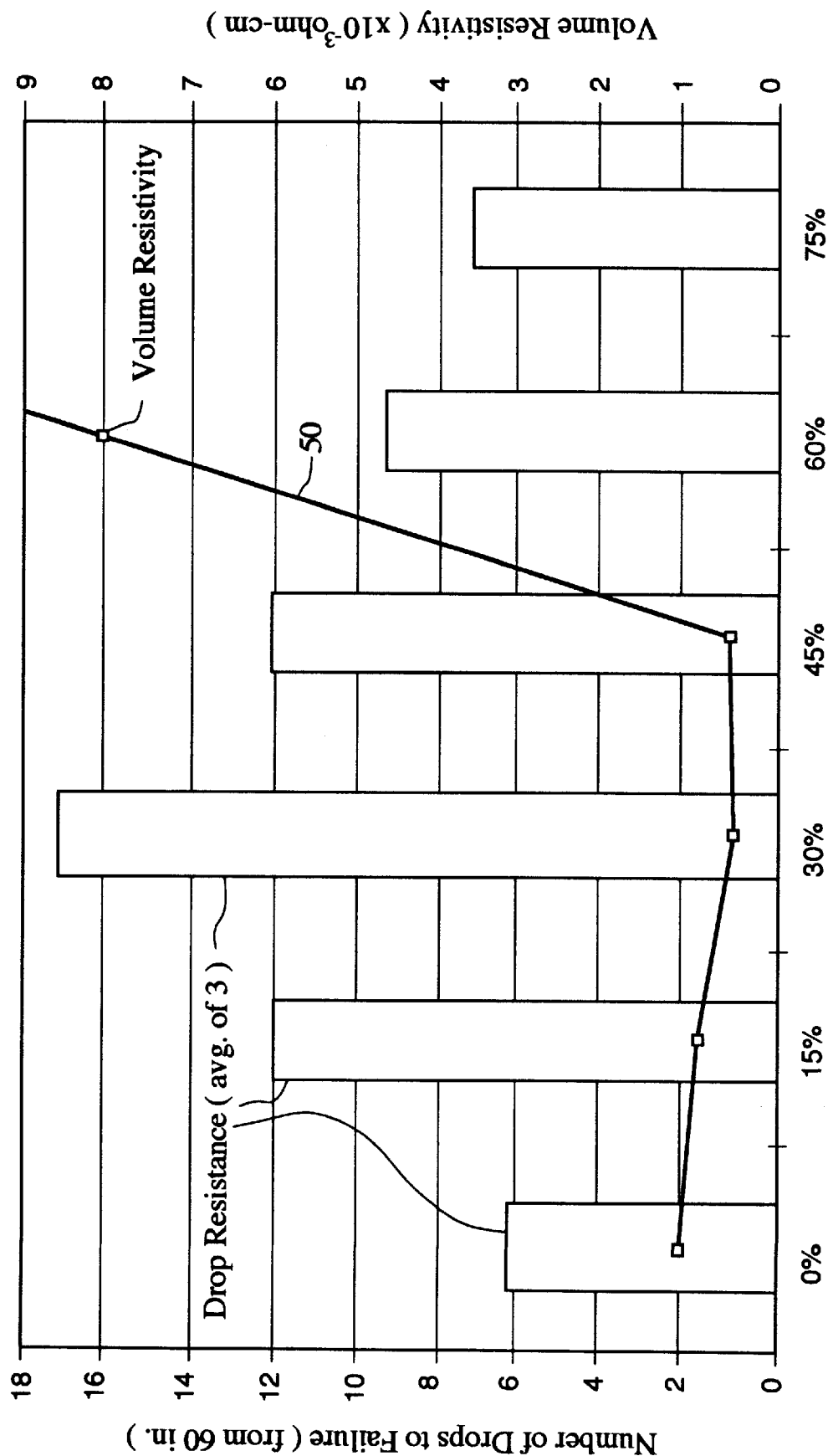
FIG. 3 is a plot of both the number of drops to failure from a 60-inch (152.4 cm) height and volume resistivity ($\times 10^{-3}$ ohm-cm) versus the weight percent of ATBN 1300X16 curing agent in the total adhesive composition.

Curve 50 of FIG. 3 illustrates how the amount of ATBN-type curing agent (namely, Hycar ATBN 1300X16) improves and, beyond a certain concentration, degrades drop resistance. Specifically, the curing agent system of FIG. 3 is given by the following formula:

N wt. % ATBN1300X16+(100-N wt. %) DP3680

The epoxy resin of FIG. 3 was 40 wt. % Bisphenol-A, 30 wt. % DER 732, and 30 wt. % Heloxy 67, and the filler, expressed as a percentage of the total adhesive composition, was 78 wt. % Technic 299. Curve 50 indicates that the volume resistivity of the adhesive composition essentially remained flat until the content of ATBN curing agent reached about 45 wt. % of the total curing agent system, after which the volume resistivity steeply increased, thereby indicating an alteration in filler compatibility with the epoxy system given greater amounts of ATBN curing agent. The bars illustrate that the drop resistance increased until the content of ATBN curing agent reached about 30 wt. %, after which the drop resistance decreased.

Thus, it has been demonstrated that adhesives formulated in accordance with the invention evidence improved mechanical shock resistance compared to epoxy-based adhesives formulated outside of the scope of the invention.

INDUSTRIAL APPLICABILITY

The cured adhesives of the invention are electrically conductive, flexible across a wide range of temperatures, and resilient, having good mechanical shock resistance and adhesion characteristics. Given these qualities, the electrically-conductive adhesives of the invention may be successfully employed in numerous industrial applications requiring automated bonding of dissimilar materials, including applications in which the surface area of the bond is relatively small. Examples of industrial applications include the surface-mount of electronic components or die-attach.

Thus, there has been disclosed a composition and a method for making an electrically-conductive, flexible epoxy adhesive that exhibits high adhesive strength and good mechanical/thermal shock resistance characteristics. It will be readily apparent to those skilled in the art that various changes and modifications of an obvious nature may be made without departing from the spirit of the invention, and all such changes and modifications are considered to fall within the scope of the invention as defined by the appended claims.

What is claimed is:

1. A drop-resistant, flexible electrically-conductive epoxy adhesive comprising the cured reaction product of:

(a) at least one flexible polyepoxide resin selected from the group consisting of the diglycidyl ether of polyoxypropylene glycol having an epoxy equivalent weight of about 320; the polyglycidyl ether of an aliphatic polyol having an epoxy equivalent weight of about 650; the diglcidyl ether of 1,4-butanediol having an epoxy equivalent weight of about 130; the diglycidyl ether of neopentyl glycol having an epoxy equivalent weight of about 135; the diglycidyl ether of cyclohexane dimethanol having an epoxy equivalent weight of about 160; and the diglycidyl ether of polyoxypropylene glycol having an epoxy equivalent weight of about 190;

(b) a substantially stoichiometric amount of curing agent comprising at least one amine-terminated butadiene-acrylonitrile polymer; and (c) an electrically-conductive filler comprising a noble metal selected from the group consisting of gold, silver platinum, nickel, and palladium and being present in said adhesive at a concentration within the range of about 20 to 30 volume percent, wherein said cured reaction product has a volume resistivity not exceeding about $10^{-3}$ ohm-cm at room temperature and a drop resistance such that a bond effected by said cured reaction product can withstand at lest six 60-inch (152 cm) drops onto a hard surface, said bond having a thickness of about 6 mils (0.015 cm).

2. The flexible electrically-conductive epoxy adhesive of claim 1 wherein said at least one amine-terminated butadiene-acrylonitrile polymer has an amine equivalent weight selected from the group consisting of 900 and 1200.

3. The flexible electrically-conductive epoxy adhesive of claim 1 further comprising at least one component selected from the group consisting of flexibilizers, diluents, thixotropic agents, ultraviolet stabilizers, antioxidants, wetting agents, anti-foaming agents, and dispersing agents.

* * * * *